US008569803B2

(12) United States Patent
Tyberg et al.

(10) Patent No.: US 8,569,803 B2
(45) Date of Patent: Oct. 29, 2013

(54) BEOL COMPATIBLE FET STRUCTRURE

(75) Inventors: Christy S. Tyberg, Mahopac, NY (US);
Katherine L. Saenger, Ossining, NY (US); Jack O. Chu, Manhasset, NY (US); Harold J. Hovel, Katonah, NY (US); Robert L. Wisnieff, Ridgefield, CT (US); Kerry Bernstein, Underhill, VT (US); Stephen W. Bedell, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/572,742

(22) Filed: Aug. 13, 2012

(65) Prior Publication Data
US 2012/0305929 A1 Dec. 6, 2012

Related U.S. Application Data

(62) Division of application No. 12/561,827, filed on Sep. 17, 2009, now Pat. No. 8,441,042, which is a division of application No. 11/358,183, filed on Feb. 21, 2006, now abandoned.

(51) Int. Cl.
*H01L 29/76* (2006.01)
(52) U.S. Cl.
USPC .......... 257/213; 257/377; 257/382; 257/390; 257/751; 257/E29.003; 257/E29.286
(58) Field of Classification Search
USPC .......... 257/66, 213, 351, 758, 751, 377, 382, 257/390
See application file for complete search history.

(56) References Cited

U.S. PATENT DOCUMENTS

| 4,621,260 A | 11/1986 | Suzuki et al. |
| 5,162,246 A | 11/1992 | Ozturk et al. |
| 5,162,892 A * | 11/1992 | Hayashi et al. .................. 257/65 |
| 6,303,486 B1 | 10/2001 | Park |
| 6,703,891 B2 | 3/2004 | Tanaka |
| 6,821,826 B1 | 11/2004 | Chan et al. |
| 7,202,566 B2 | 4/2007 | Liaw |
| 7,413,939 B2 | 8/2008 | Hsu et al. |

(Continued)

FOREIGN PATENT DOCUMENTS

JP 2005-101141 4/2005

OTHER PUBLICATIONS

Yu, D. S., et al., "Three-Dimensional Metal Gate-High-k-GOI CMOSFETs on 1-Poly-6 Metal 0.18-mm Si Devices," IEEE Electron Device Lett., vol. 26, No. 2, pp. 118-120, Feb. 2005.

(Continued)

*Primary Examiner* — A. Sefer
(74) *Attorney, Agent, or Firm* — Ohlandt, Greeley, Ruggiero & Perle, L.L.P.; Daniel P. Morris

(57) ABSTRACT

This invention provides structures and a fabrication process for incorporating thin film transistors in back end of the line (BEOL) interconnect structures. The structures and fabrication processes described are compatible with processing requirements for the BEOL interconnect structures. The structures and fabrication processes utilize existing processing steps and materials already incorporated in interconnect wiring levels in order to reduce added cost associated with incorporating thin film transistors in the these levels. The structures enable vertical (3D) integration of multiple levels with improved manufacturability and reliability as compared to prior art methods of 3D integration.

13 Claims, 12 Drawing Sheets

(56) References Cited

U.S. PATENT DOCUMENTS

| | | |
|---|---|---|
| 2001/0000756 A1 | 5/2001 | Batra et al. |
| 2001/0028059 A1* | 10/2001 | Emma et al. .................... 257/67 |
| 2002/0004293 A1 | 1/2002 | Soininen et al. |
| 2002/0187572 A1 | 12/2002 | Dai et al. |
| 2004/0266168 A1 | 12/2004 | Koyanagi |
| 2005/0012099 A1 | 1/2005 | Couillard et al. |
| 2005/0079660 A1 | 4/2005 | Murthy et al. |
| 2005/0121789 A1 | 6/2005 | Madurawe |
| 2005/0196962 A1 | 9/2005 | Demeurisse et al. |
| 2006/0125058 A1* | 6/2006 | Gonzalez ..................... 257/619 |
| 2009/0294803 A1 | 12/2009 | Nuzzo et al. |

OTHER PUBLICATIONS

Wei, L., et al., "Vertically Integrated SOI Circuits for Low-Power and High-Performance Applications," IEEE Transactions on Very Large Scale Integration (VLSI) Systems, vol. 10, No. 3, pp. 351-362, Jun. 2002.

* cited by examiner

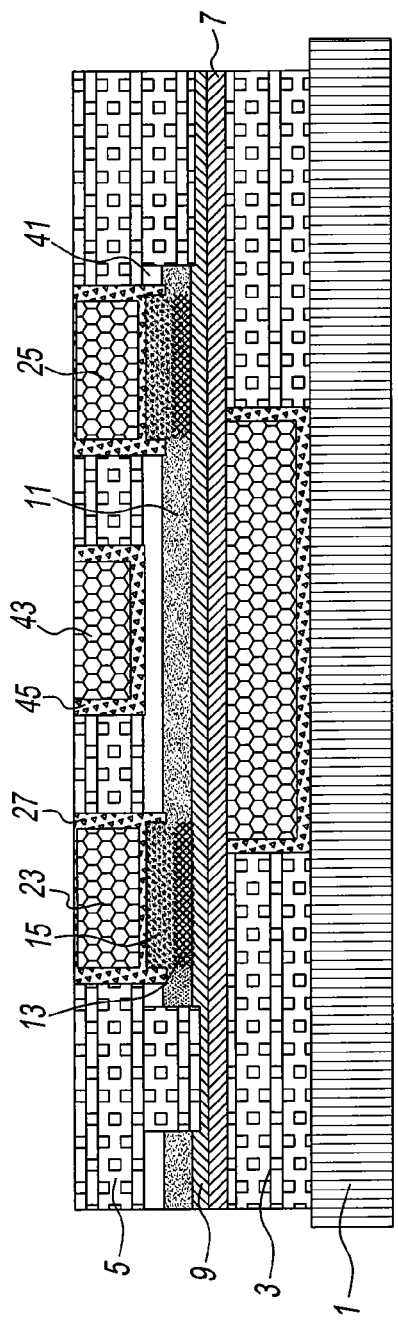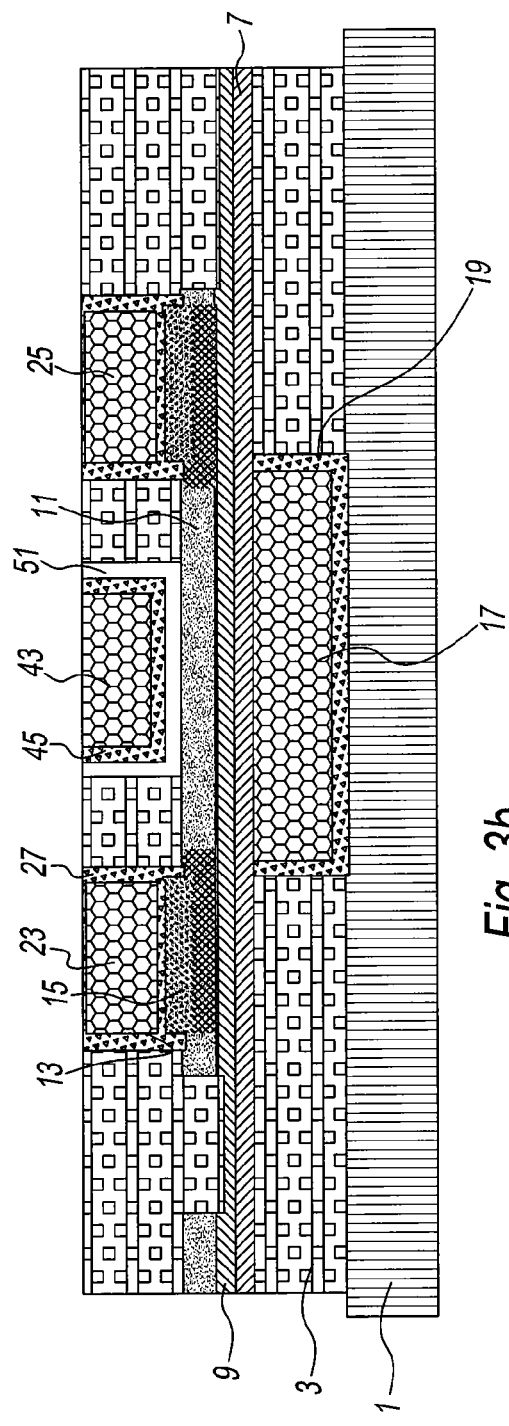

| | |
|---|---|
| 1 | Form first Interlayer Dielectric on Substrate |
| 2 | Form conducting metal structures in said first interlayer dielectric by standard Single or dual damascene processing |
| 3 | Deposit insulating material(s) |
| 4 | Deposit semiconductor material and optionally anneal |
| 5 | Pattern semiconductor material using standard patterning and etching steps |
| 6 | Deposit second planarizing interlayer dielectric material and optionally sacrificial hardmask layer(s) |
| 7 | Pattern second interlayer dielectric material forming openings to said semiconductor material |
| 8 | Form doped regions by implanting dopant materials through said openings |
| 9 | Optionally form germanide regions by depositing metal, anneal, then removing metal |
| 10 | Fill etched regions with planarizing material |
| 11 | Pattern/etch line and/or via interconnect structures by standard single or dual damascene processes |
| 12 | Metalize etched structures |

Fig. 8

BEOL COMPATIBLE FET STRUCTRURE

CROSS-REFERENCE TO RELATED APPLICATIONS

This application is a divisional of U.S. application Ser. No. 12/561,827, filed Sep. 17, 2009, which is a divisional of U.S. application Ser. No. 11/358,183 filed Feb. 21, 2006, now abandoned, both of which are incorporated herein by reference.

BACKGROUND OF THE INVENTION

1. Field of the Invention

This invention generally relates to the fields of semiconductor integrated circuits and electrical interconnect technology, and more particularly relates to vertical or 3D integration of devices such as thin film transistors (TFTs) into back end of the line (BEOL) interconnect structures.

2. Description of the Related Art

In recent years 3D integration has gained significant attention as a possible pathway for increasing IC density and for reducing interconnect delays and ac power consumption (by reducing interconnect distances).

In one prior art technique for fabricating 3D integrated circuits, a process called "smart cut" wafer bonding is used to form a single crystal germanium layer above passivated metal interconnect levels on a silicon device level. This method is described, for example, in Yu. D. S et al, "Three-Dimensional Metal Gate-High-k-GOI CMOSFETs on 1-Poly-6-Metal 0.18-mm Si Devices," *IEEE Electron Device Lett.*, vol. 26, no. 2, pp. 118-120, February 2005. This method utilizes germanium as an additional device layer stacked over the device layer in the base substrate. Ge offers the advantage of lower temperature processing compared to silicon, a critical factor for vertically integrated device structures that are formed after the first silicon device layer and metal interconnect layers.

However, this method is associated with significant manufacturing problems, which arise from the requirement for wafer bonding above an already-formed interconnect structure. In addition to the cost of wafer bonding, there are concerns with reliability of bonding above the already-formed layers. The cost of losing all of the chips on a 300 mm wafer due to a problem during bonding would be tremendous. Additionally, this type of 3D integration is limited in that it is not easily imbedded in multiple back end of the line (BEOL) wiring levels along with the interconnect structures.

In another prior art 3D vertical integration structure, multiple levels of devices are placed one above the other utilizing single crystal silicon formed by lateral epitaxial growth from a vertical column of silicon seed originating from the Si substrate. This structure is described, for example, in Wei, L. et al. "Vertically Integrated SOI Circuits for Low-Power and High-Performance Applications," *IEEE Transactions on Very Large Scale Integration (VLSI) systems*, vol. 10, no. 3, pp. 351-362, June 2002.

This epitaxial growth method of vertical integration has the disadvantage that it is limited to a location close to a seed column.

In addition, Silicon devices require high temperatures for both forming the silicon layer and for later processing steps such as dopant activation. These high temperatures can cause significant degradation to the first device level and prevent the possibility of incorporating these structures in the same level as the back end of the line interconnect levels which are typically limited to a processing temperature of less than 400-450° C.

Therefore, there is a need for a simplified, cost-effective, 3D vertical integration structure and method that could be formed from primarily existing steps and would be compatible with the processing requirements of the BEOL interconnect levels. Implementation of devices into the BEOL wiring levels using primarily standard BEOL processing steps would enable a more cost effective path to 3D integration as compared with the existing prior art.

SUMMARY OF THE INVENTION

The present invention provides a vertically (3D) integrated structure that is formed without using any high temperature (>450° C.) processes that could damage the underlying silicon device level or the BEOL interconnect levels. The structure allows for the incorporation of nFETs, pFETs, and/or other devices as needed by the targeted application.

These devices can be in multiple levels, selected from those just above the silicon device layer to those separated from the silicon device layer by multiple levels of wiring. The structure includes devices in the same levels with BEOL interconnect wiring and incorporates many processing steps that are already used to form the metal interconnects, therefore reducing added cost of forming the devices. The devices, thin film transistors (TFTs), are formed on thin polycrystalline semiconductor films that can be deposited at any level of the interconnect structure.

Although these devices can have an inferior mobility and Ion/Ioff ratio compared to advanced single crystal silicon devices due to the grain boundaries in the polycrystalline film, these devices are targeted toward applications that do not require the high performance of the standard single crystal silicon devices in the bottom level. The materials in the present invention have been selected to optimize the performance of the polycrystalline devices while at the same time allowing for lower temperature (<450° C.) processing.

The present invention achieves significant circuit area/footprint reduction of the single crystal device level by enabling the incorporation of selected circuits, i.e., those that do not require the high performance of the single crystal device level, into upper levels of the chip.

Thus, it is an object of the present invention to provide an electrical interconnect structure containing thin film transistors within one or more of interconnect wiring levels.

The thin film transistor is comprised of a metal gate and metal source and drain contacts that contain the same materials as the metal interconnect wiring.

The semiconductor material in the thin film transistor is a polycrystalline material that can be formed by deposition or deposition plus annealing steps at temperatures below 450° C.

The structure can be prepared with minimal additional processing steps in a standard single or dual damascene interconnect structure.

The structure and method of the preferred embodiment minimizes additional processing steps and allows implementation in a copper plus low k dielectric back end of the line (BEOL) interconnect structure.

Further, the structure of the preferred embodiment incorporates semiconductor materials including polycrystalline germanium and cadmium selenide, which have significantly higher bulk mobilities than polycrystalline or amorphous silicon.

Devices formed from these materials are also compatible with processing temperatures at or below 450° C., temperatures significantly lower than those required in polycrystalline or amorphous silicon devices to achieve close to equivalent performance. In addition, the structure of the preferred embodiment incorporates copper as the metal gate and source/drain contacts. The copper can be deposited simultaneously with the copper wiring in the interconnect structure reducing additional processing steps and added costs.

The method of the preferred embodiment incorporates several existing dual damascene BEOL process steps in the formation of the thin film transistors. In many cases, these processes are performed simultaneously with formation of the line and via interconnect structures.

Accordingly, it is an object of this invention to provide a thin film transistor structure within a low-k dielectric plus Cu interconnect structure of the single or dual damascene type.

It is another object of this invention to provide a self-aligned thin film transistor structure within a low-k dielectric plus Cu interconnect structure of the single or dual damascene type.

It is still another object of this invention to provide an electrical interconnect structure containing p-type thin film transistors in one BEOL wiring level and n-type thin film transistors in a second BEOL wiring level.

It is yet another object of this invention to provide a method to make the inventive structures described herein.

Accordingly, the present invention provides a electrical interconnect structure having thin film transistors including:

a first dielectric containing a plurality of conductors wherein some of the conductors form conducting lines and/or vias, and other conductors form gate electrodes of the thin film transistors;

an insulating material atop the gate electrodes;

a semiconductor having spaced-apart doped source and drain regions with a channel disposed there between atop the insulating material; and a second dielectric having a plurality of conductors where some conductors form conducting lines and/or vias, and other conductors form contacts to the source and drain regions of the thin film transistors.

The present invention provides an integrated circuit structure including:

a layer of active circuit devices on a substrate;

a plurality of layers having random or regular layouts of interconnecting line and/or via structures above the layer of active circuit devices; wherein the plurality of layers have at least a layer having both interconnecting line and/or via structures and a multiplicity of thin film transistors with self-aligned overlap between the source and drain regions and the gate electrode, which layer includes at least a first dielectric containing conducting line and/or via interconnect structures and a self aligned thin film transistor structure having a semiconductor material, a gate dielectric, a gate electrode, spaced apart doped source and drain regions within the semiconductor material that extend just to the edges of the gate electrode with a self-aligned controlled degree of overlay conducting metal contacts contacting the source and drain regions; and optionally at least one of:

a second dielectric material between the source and drain contacts and the gate electrode;

a conducting diffusion barrier materials on at least one side of any or all of the conducting line or via interconnect structures, the gate electrode, and the conducting metal contacts contacting the source and drain regions;

a region between the source and drain contacts and the doped source and drain regions which acts for improving the contacts to the source and drain regions; wherein the region includes metal germanides, metal silicides, or mixtures of metal germanides and metal silicides; wherein the metal is selected from: Ni, Co, Pd, Pt, Nb, Ti, Zr, Hf, Ta, Cr, Mo, W, Er and Ir.

The present invention still further provides a thin film transistor with germanium-containing semiconductor region, including:

spaced-apart doped source and drain regions with a channel region disposed there between;

a gate dielectric in contact with the channel region; and a conductive Cu-containing gate.

The present invention additionally provides a method of forming a damascene electrical interconnect structure containing thin film transistors including the steps of:

forming a first interlayer dielectric on a substrate;

forming conducting metal structures in the first interlayer dielectric by standard single of dual damascene processing;

depositing and insulating material or materials;

depositing a semiconductor material;

patterning the semiconductor material;

depositing a second planarizing interlayer dielectric material;

patterning the second interlayer dielectric material forming openings to expose the semiconductor material;

forming doped regions in the semiconductor material;

etching the doped regions in the semiconductor material;

filling the etched regions with a sacrificial planarizing material;

patterning and etching to form openings that will become line and via interconnect structures; and metallizing the openings to form source and drain contacts and interconnect structures.

BRIEF DESCRIPTION OF THE DRAWINGS

FIGS. 3a and 3b are schematic drawings illustrating cross-sectional views of two variations of the inventive structure in a third embodiment with a double gated structure.

FIG. 8 is a list of steps in the method to make the structure of the first embodiment.

DETAILED DESCRIPTION OF THE PREFERRED EMBODIMENTS

Structure According to the Invention

Figure 1:
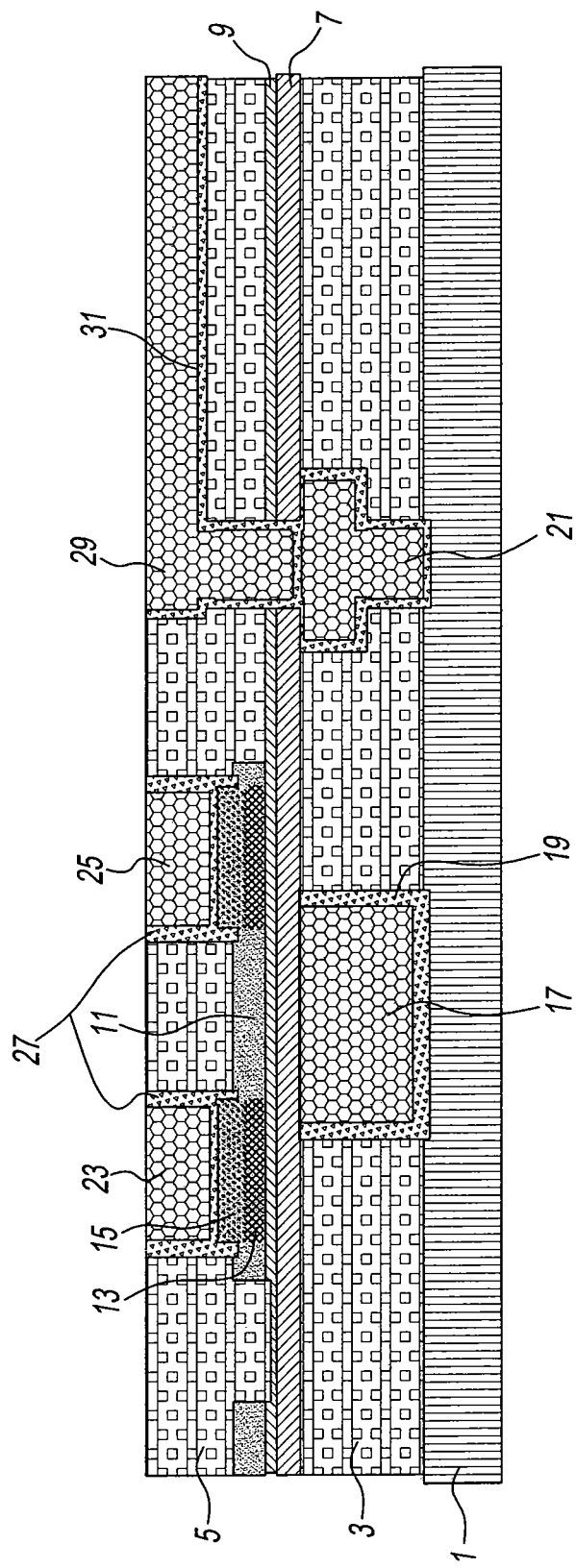
FIG. 1 is a schematic drawing illustrating a cross-sectional view of the inventive structure in a first embodiment with utilization of an insulating diffusion barrier.

Referring to FIG. 1, an electrical interconnect structure containing thin film transistors includes a substrate 1, a first interlayer dielectric layer 3 containing conducting line and/or via interconnect structures 21 and a gate electrode 17, an insulating diffusion barrier 7 to prevent diffusion of the metal in the gate electrode or interconnect structures and act as the gate dielectric material, a second interlayer dielectric material 5, containing conducting line and/or via interconnect structures 29, a semiconductor material 11 above the metal gate electrode, spaced apart doped regions 13 within the semiconductor material which act as the source and drain regions of the thin film transistor, and conducting metal contacts 23 and 25 contacting the source and drain regions.

The structure can further include a conducting diffusion barrier liner 19 on at least one surface of the gate electrode 17. The structure can further include a conducting diffusion barrier liner 27 on at least one surface of the conducting metal contacts 23 and 25. The structure can further include a conducting diffusion barrier liner 31 on at least one surface of the line and via structures 29 and 21.

The structure can also include an additional thin layer 9 above the insulating diffusion barrier 7, which can be a layer which improves interface properties of the gate insulator stack, or improves nucleation of overlying semiconductor material 11.

The structure can further include a region 15 between the source and drain contacts and the doped source and drain regions which acts to improve the contacts to the source and drain regions. The region 15 can be comprised of metal germanides, metal silicides, and mixtures of metal germanides and metal silicides, where metal is selected from the group including but not limited to Ni, Co, Pd, Pt, Nb, Ti, Zr, Hf, Ta, Cr, Mo, W, Er, and Ir.

The structure can further include a thin capping layer atop the semiconductor material to protect the semiconductor material from oxidation or degradation.

The electrical interconnect structure can include multiple interconnect levels with multiple levels of thin film transistors. In one embodiment, the electrical interconnect structure contains n-type thin film transistors in one set of interconnect levels and p-type thin film transistors in a second set of interconnect levels. These n-type and p-type thin film transistors can include the same or different semiconductor materials. In one specific embodiment, the n-type transistors can be formed with CdSe as the semiconductor material and the p-type transistors can be formed with polycrystalline Ge as the semiconductor material.

This structure allows for incorporation into a standard BEOL process flow with minimal additional processing steps. This structure utilizes damascene processing and can incorporate standard BEOL materials including Cu metallization and Ta containing liners to form the gate and source drain contacts.

The gate can be formed simultaneously with the line and via wiring of that dual damascene level with no additional processing steps. One additional masking step will be required to form the isolation trenches and remove any poly-Ge or other semiconductor material from regions outside the TFT structure. A second additional masking step would typically be required to define the source and drain regions. However, it should be feasible to deposit liner, plate Cu, and CMP the source drain contacts in the same step as the line and via wiring. The additional processing steps not typically encountered in BEOL processing include the following: deposition and patterning of semiconductor 11, doping of source and drain regions (for example, by ion implantation), and the metal deposition, anneal, and wet etch removal steps associated with germanide or silicide formation.

In this structure standard BEOL Cu barrier materials such as SiN or SiCN, SiCHN, can be used as the gate dielectric. This allows the minimal amount of changes to the standard BEOL process flow.

Figure 2:
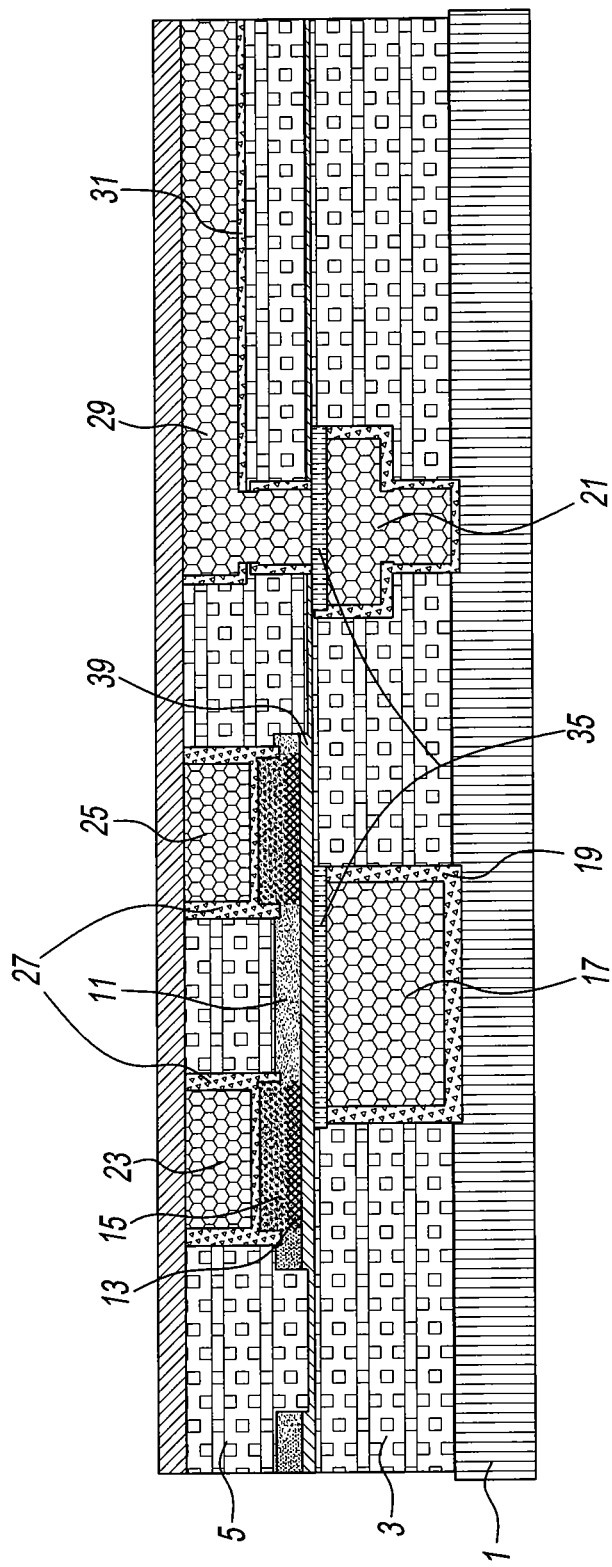
FIG. 2 is a schematic drawing illustrating a cross-sectional view of the inventive structure in a second embodiment with utilization of a selectively aligned diffusion barrier.

Referring to FIG. 2, an alternative structure can incorporate all of the components described in FIG. 1 except for the insulating diffusion barrier material. This structure can include a selective metal diffusion barrier 35 atop the gate electrode and the line and/or via patterns instead of the insulating diffusion barrier material. This structure also includes a thin insulating material 39 atop the gate electrode to act as the gate dielectric of the thin film transistor structure.

This structure has the advantage of enabling a thinner gate dielectric with more flexibility on the material choices for the gate dielectric material. Selective metal diffusion barriers of this type are described in U.S. Pat. No. 5,695,810 entitled "Use of Cobalt Tungsten Phosphide as a barrier Material for Copper Metallization" by Valery M. Dubin et al., and the commonly owned U.S. Patent Application Publication Number US 2005/0127518 A1 entitled "Electroplated CoWP Composite Structures as Copper barrier layers" by Cyril Cabral Jr. et al., the contents of which are incorporated herein by reference in their entirety as fully set forth herein.

Selective metal caps, such as CoWP have been under investigation to replace the dielectric cap in the BEOL wiring levels for several years in order to reduce the capacitance of the structure. Incorporation of a selective metal cap would prevent the need for the thicker insulating barrier layer and would enable the use of a very thin gate dielectric, which could significantly improve the properties of the device.

The first interlayer dielectric layer 3 and second interlayer dielectric layer 5 can be the same or different materials and can be comprised of but not limited to an insulating oxide, a low k dielectric material, a porous low k dielectric material, a dielectric containing air gaps. The insulating diffusion barrier material 7 can be comprised of SiN; materials containing Si, C, N, and H; materials containing Si, C, and H; or other insulating materials that have barrier properties that prevent metal diffusion of the gate metal 17. The conducting line and/or via interconnect structures 21 and 29, can be comprised of Cu, Al, W, Ag or other like metals which are typically used in interconnect structures. The gate electrode 17 can be comprised of but is not limited to Cu, Al, W, Ag, Er, Ni, Co, Au, Sn, poly-Si, poly-Ge, or other materials which are typically used in interconnect structures or gate electrodes. The source and drain contacts 23 and 25 can be comprised of but are not limited to, Cu, Al, W, Ag, Er, Ni, Co, Au, Sn or other like metals which are typically used in interconnect structures or contacts.

Preferably, the metal gate electrode 17 and source drain contacts 23 and 25 are formed from the same material which forms the conducting line and/or via structures 21 and 29.

The conducting diffusion barrier liners 19, 27, and 31 can be the same or different materials and can be comprised of, but are not limited to: TiN, TaN, TiSiN, other metal nitrides and metal silicon nitrides, conductive metal carbides, Ti, Ta, W, WN, Cr, Nb and other like materials including combinations thereof. The semiconductor material 11 can be comprised of, but is not limited to, polycrystalline Ge, polycrystalline SiGe, CdSe, polycrystalline Si, amorphous Si, amorphous Ge. These materials can further include carbon, InAs, InAlAs, InGaAs or other III-V compounds.

Preferably the semiconductor material is a polycrystalline material with a bulk mobility of greater than 100 cm$^2$/Vs, is formed at temperatures below 450° C., from which devices can be fabricated with a maximum processing temperature of less than 450° C. More preferably the semiconductor material is polycrystalline Ge, polycrystalline SiGe, or CdSe.

The dopant in the doped semiconductor region 13 can be comprised of, but is not limited to, B, As, P, Ga, In, Al, Zn or other like materials. The selective metal diffusion barrier 35 can be comprised of but is not limited to CoWP, Ta, W, Mo, TiW, TiN, TaN, WN, TiSiN, TaSiN, and other like materials including combinations thereof. The thin material 9 includes one or more layers of a material, such as, SiO2, silicon nitride, silicon oxynitride, silicon-containing oxides, insulating metal oxides, insulating metal nitrides, insulating metal silicon oxides, insulating metal silicon oxynitrides, germanium oxynitride, germanium-containing oxide, insulating metal germanium oxides, insulating metal germanium oxynitrides, amorphous silicon, and Si or Ge-containing seed layers, without being limited thereto.

The thin insulating material 39 can be SiO2, silicon oxynitride, silicon-containing oxides, insulating metal oxides, insulating metal nitrides, insulating metal silicon oxides, insulating metal silicon oxynitrides, germanium oxynitride, germanium-containing oxides, insulating metal germanium oxides, insulating metal germanium oxynitrides, but are not limited thereto.

Referring to FIG. 3, in another embodiment of the invention the structure can further include a second gate electrode 43 above the semiconductor region 11, which is separated from the semiconductor region by an insulating material 41 or 51. Referring to FIG. 3a the insulating material 41 can cover the entire semiconductor region or referring to FIG. 3b the insulating material 51 can surround the gate electrode. The structure can further include a conducting diffusion barrier liner 45 surrounding the gate electrode 43.

Figure 4:
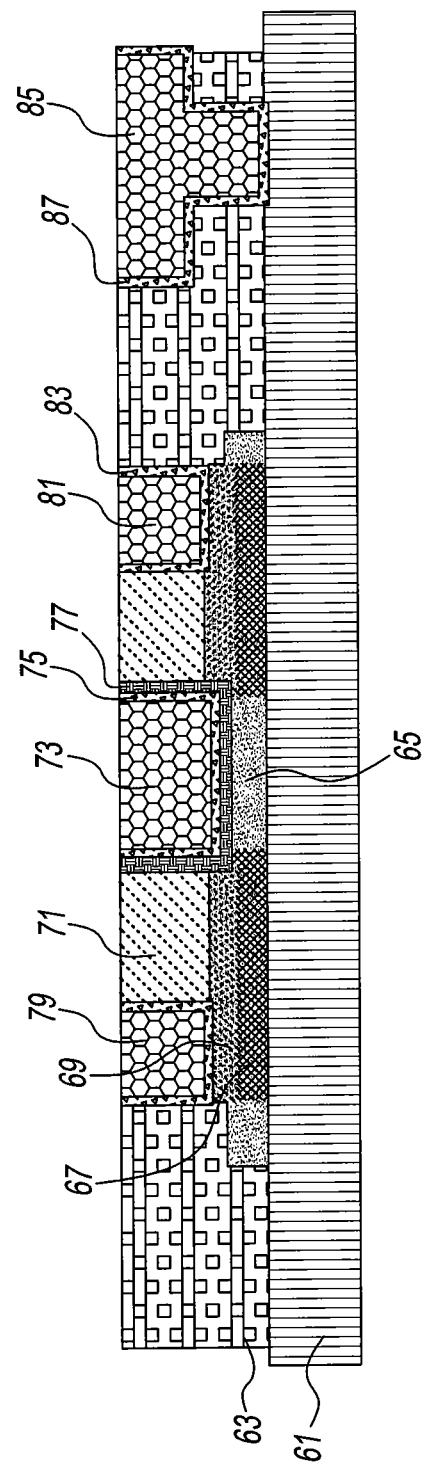
FIG. 4 is a schematic drawing illustrating a cross-sectional view of the inventive structure in a fourth embodiment with a self aligned source and drain region.

Referring to FIG. 4, in another embodiment of the invention the source and drain regions are self aligned by the gate allowing a very controlled degree of overlap between the gate and the source and drain. The electrical interconnect structure containing self-aligned thin film transistors, includes a substrate 61, a first interlayer dielectric layer 63 containing conducting line and/or via interconnect structures 85, and a self aligned thin film transistor structure containing a semiconductor material 65, spaced apart doped source and drain regions within the semiconductor material 67, a gate insulator material 77, a gate electrode 73, and conducting metal contacts 79 and 81 contacting the source and drain regions.

The structure can further include a second dielectric material 71 between the source and drain contacts and the gate electrode.

The structure can still further include conducting diffusion barrier materials (87, 83, 75) on at least one side of any or all of the conducting line or via interconnect structures 85, the gate electrode 73, or the conducting metal contacts 79 and 81 contacting the source and drain regions.

The structure can further include a region 69 between the source and drain contacts and the doped source and drain regions which acts to improve the contacts to the source and drain regions. The region 69 can be comprised of metal germanides, metal silicides, and mixtures of metal germanides and metal silicides, where metal is selected from the group including but not limited to Ni, Co, Pd, Pt, Nb, Ti, Zr, Hf, Ta, Cr, Mo, W, and Ir.

Figure 5:
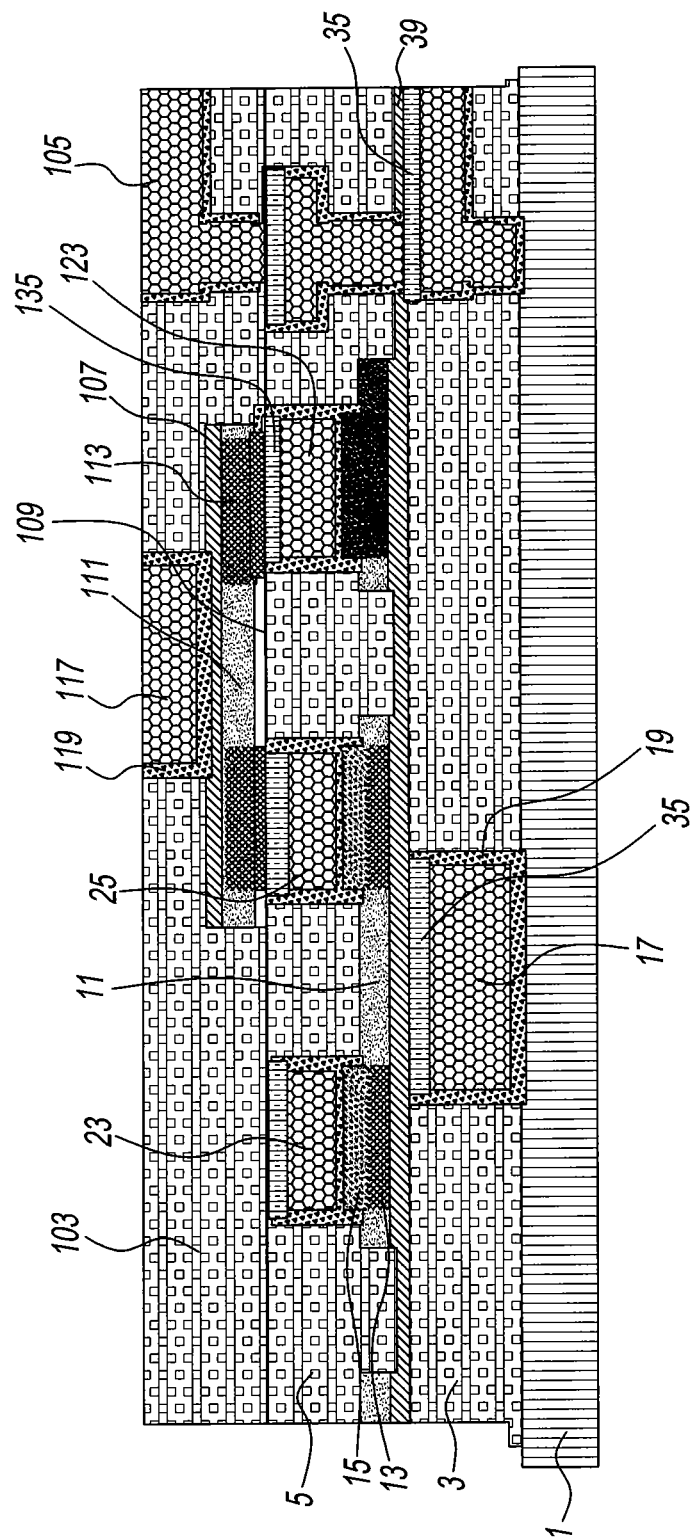
FIG. 5 is a schematic drawing illustrating a cross-sectional view of the inventive structure in a fifth embodiment with a cross-point structure.

Referring to FIG. 5, in another embodiment of the invention the structure can include a cross-point thin film transistor structure within an electrical interconnect structure. The structure includes a substrate 1, a first interlayer dielectric layer 3 containing conducting line and/or via interconnect structures and a gate electrode 17, a thin insulating material 39 atop the gate electrode, the insulating material acting as the gate dielectric of the thin film transistor, a second interlayer dielectric material 5, containing conducting line and/or via interconnect structures, a semiconductor material 11 above the metal gate electrode, spaced apart doped regions 13 within the semiconductor material which act as the source and drain regions, and conducting metal contacts 23, 25, and 123 contacting the source and drain regions.

The structure can further include a third interlayer dielectric layer 103 containing conducting line and/or via interconnect structures 105, a semiconductor material 111 above at least two of the source and drain contacts, spaced apart doped regions 113 within the semiconductor material which act as source and drain regions, a gate dielectric material 107, and a gate electrode 117 overlapping partially with the source and drain regions 113.

The structure can still further include a selective metal diffusion barrier 35 atop the gate electrode 17 or 117, and the line and/or via patterns 105. The structure can further include a selective metal diffusion barrier 135 atop the conducting metal contacts 23, 25, and 123.

The structure can further still include a thin seed layer 109 to improve the deposition of the semiconductor material. The seed layer can also have doped regions.

The structure can additionally include a conducting diffusion barrier liner 19, 119 on at least one side of the gate electrodes, the source and drain contacts, or the conducting line and/or via interconnect structures.

The structure also includes conducting contacts in contact with the source and drain contacts and the gate electrodes. These contacts are out of the plane illustrated in this figure and therefore are not represented in the figure.

The structure can further include a region 15 between the source and drain contacts and the doped source and drain regions which acts to improve the contacts to the source and drain regions. The region 69 can be of metal germanides, metal silicides, and mixtures of metal germanides and metal silicides, where metal is selected from the group including, but not limited to, Ni, Co, Pd, Pt, Nb, Ti, Zr, Hf, Ta, Cr, Mo, W, and Ir.

The structure can further include a thin capping layer atop the semiconductor material to protect the semiconductor material from oxidation or degradation.

Figure 6:
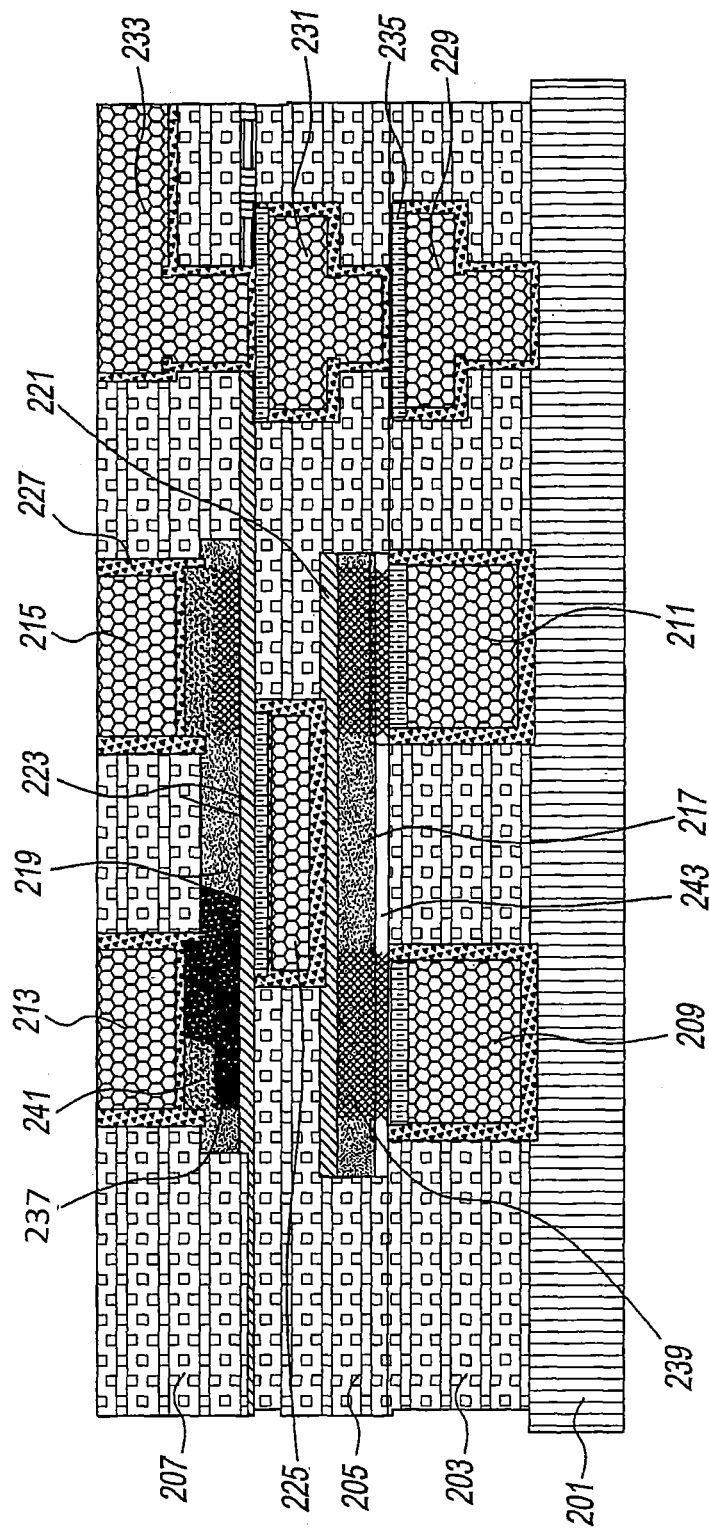
FIG. 6 is a schematic drawing illustrating a cross-sectional view of the inventive structure in a sixth embodiment with a dual channel structure.

Referring to FIG. 6, which depicts another embodiment of the invention, the structure can include a dual channel thin film transistor within an electrical interconnect structure. The structure includes a substrate 201, a first interlayer dielectric layer 203 containing conducting line and/or via interconnect structures 229, and conducting metal contacts 209 and 211, a second interlayer dielectric layer 205 containing conducting line and/or via interconnect structures 231, a semiconductor material 217 above the conducting metal contacts, spaced apart doped regions 239 within the semiconductor material, the spaced apart doped regions 239 acting as source and drain regions, a gate dielectric 221 atop the semiconductor material, and a gate electrode 225 atop the gate dielectric, a second gate dielectric 223 atop the gate electrode, a third interlayer dielectric layer 207 containing conducting line and/or via interconnect structures 233, a semiconductor material 219 above the gate electrode, spaced apart doped regions 237 within the semiconductor material, the spaced apart doped regions 237 acting as source and drain regions, and conducting metal contacts 213 and 215 in contact with the spaced apart doped regions.

The structure can further include a selective metal diffusion barrier 235 atop one of the conducting metal contacts 209, 211 213, and 215, the interconnect structures 229, 231, and 233, and the gate electrode 225. The structure can further include a conducting diffusion barrier liner 227 on at least one surface of any of the conducting line and/or via interconnect structures 229, 231, 233, conducting metal contacts 209, 211, 213, 215, and gate electrode 225.

The structure can still further include regions 241 between the source and drain contacts and the doped source and drain regions which acts to improve the contacts to the source and drain regions. The regions 241 can be comprised of metal germanides, metal silicides, and mixtures of metal germanides and metal silicides, where the metal is selected from the group including but not limited to Ni, Co, Pd, Pt, Nb, Ti, Zr, Hf, Ta, Cr, Mo, W, and Ir.

The structure can further include a thin seed layer 243 to improve the deposition of the semiconductor material. The seed layer can also have doped regions.

The structure can further include a thin capping layer atop the semiconductor material to protect the semiconductor material from oxidation or degradation.

The structure further includes conducting contacts in contact with the source and drain contacts and the gate electrodes. These contacts are out of the plane illustrated in the figure and therefore are not represented in the figure.

Method According to the Invention

Figure 7:
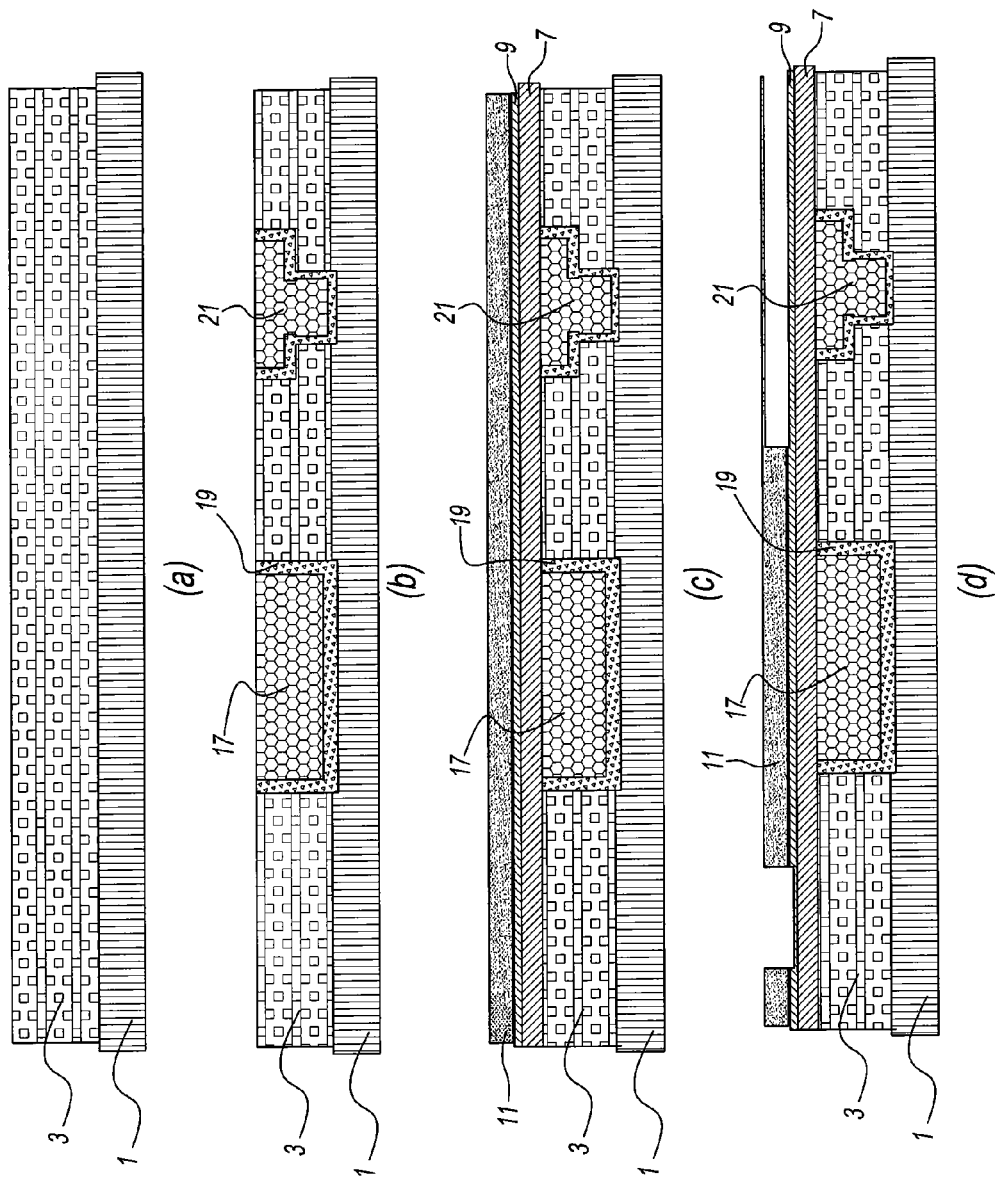
FIGS. 7a-L are schematic drawings illustrating a cross-sectional view of the structure of the first embodiment (Structure L) and the intermediate structures (structures a-k) leading thereto as they are being constructed according to the steps of the method of the present invention.
Figure 7:
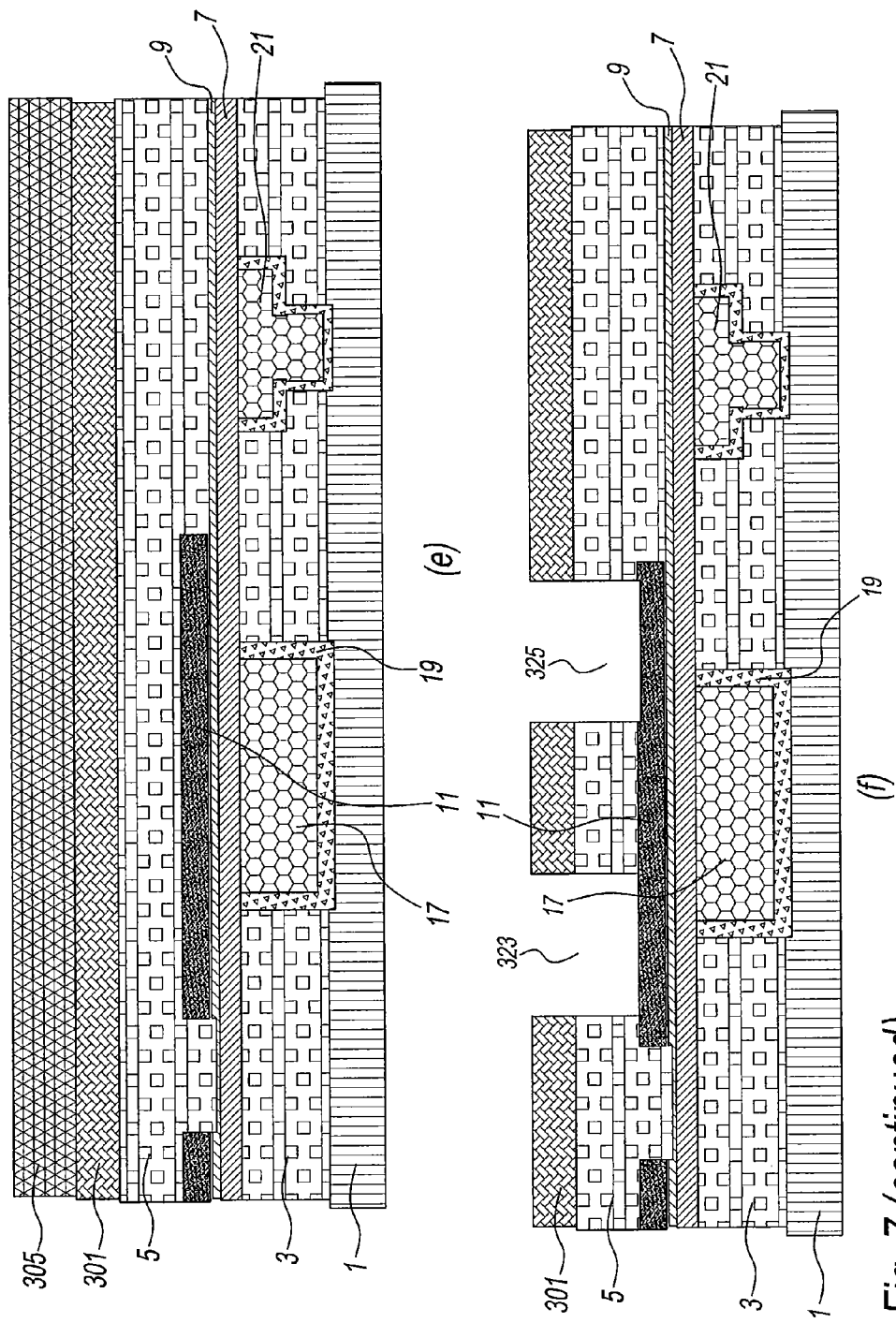
Figure 7:
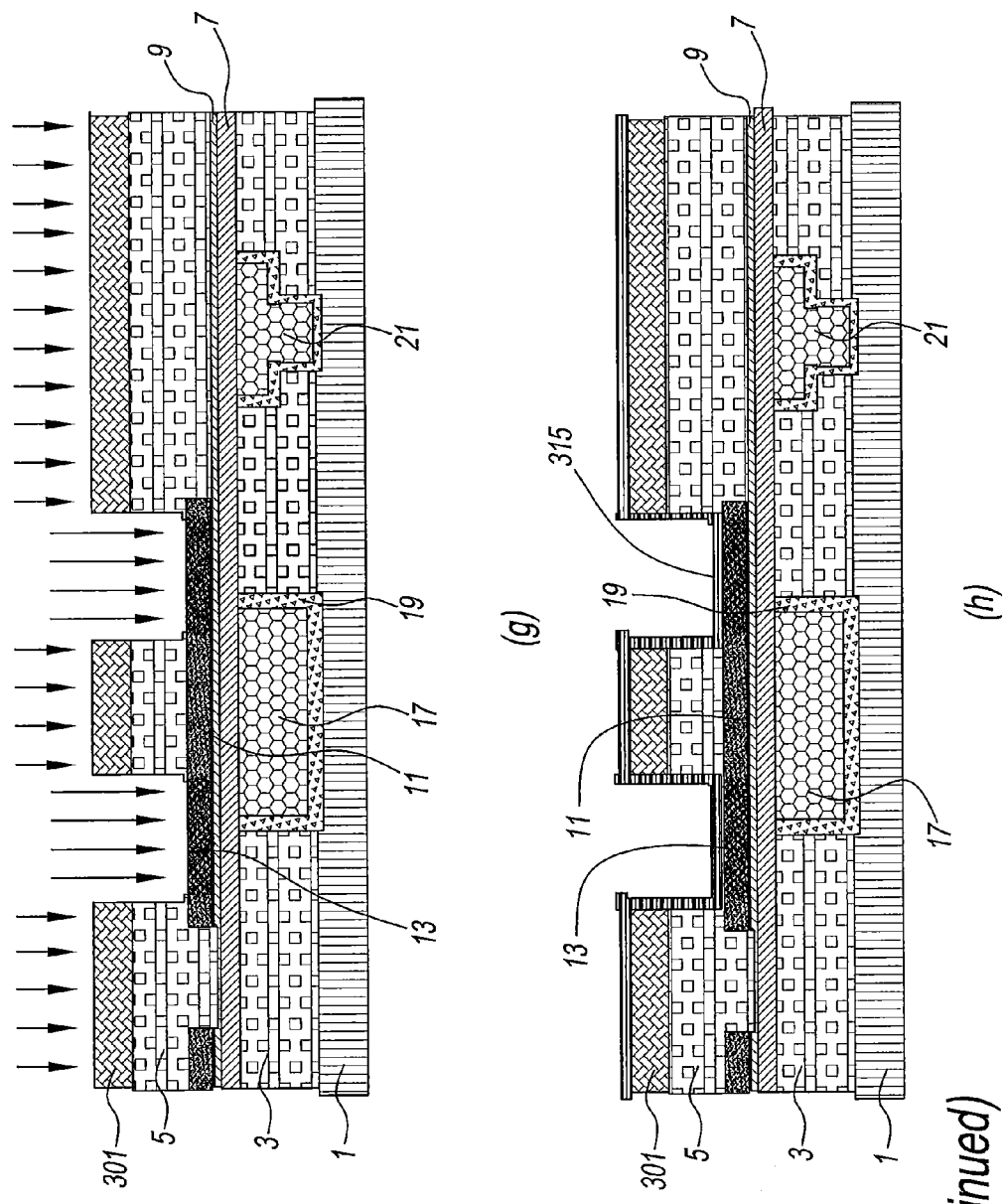
Figure 7:
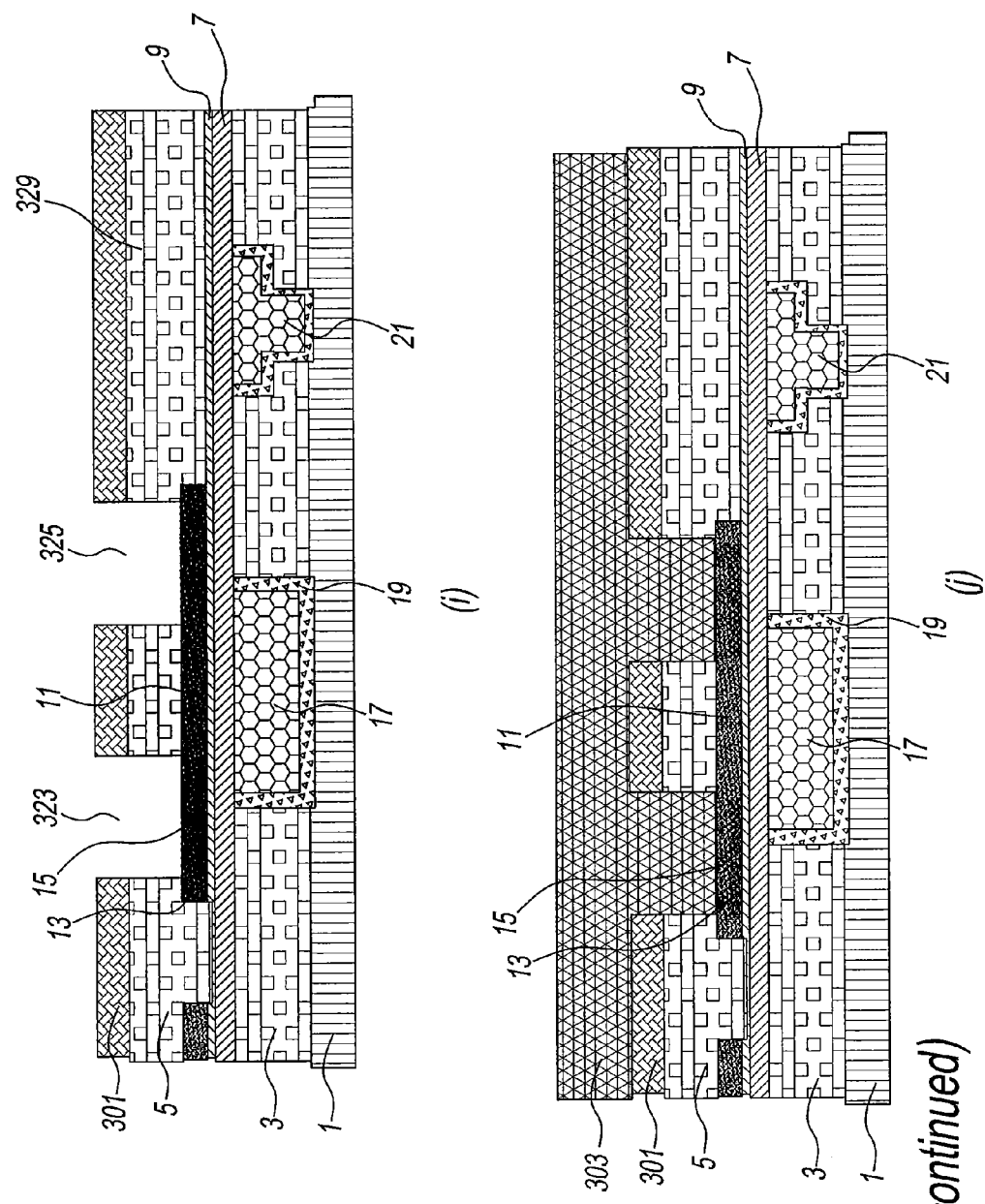
Figure 7:
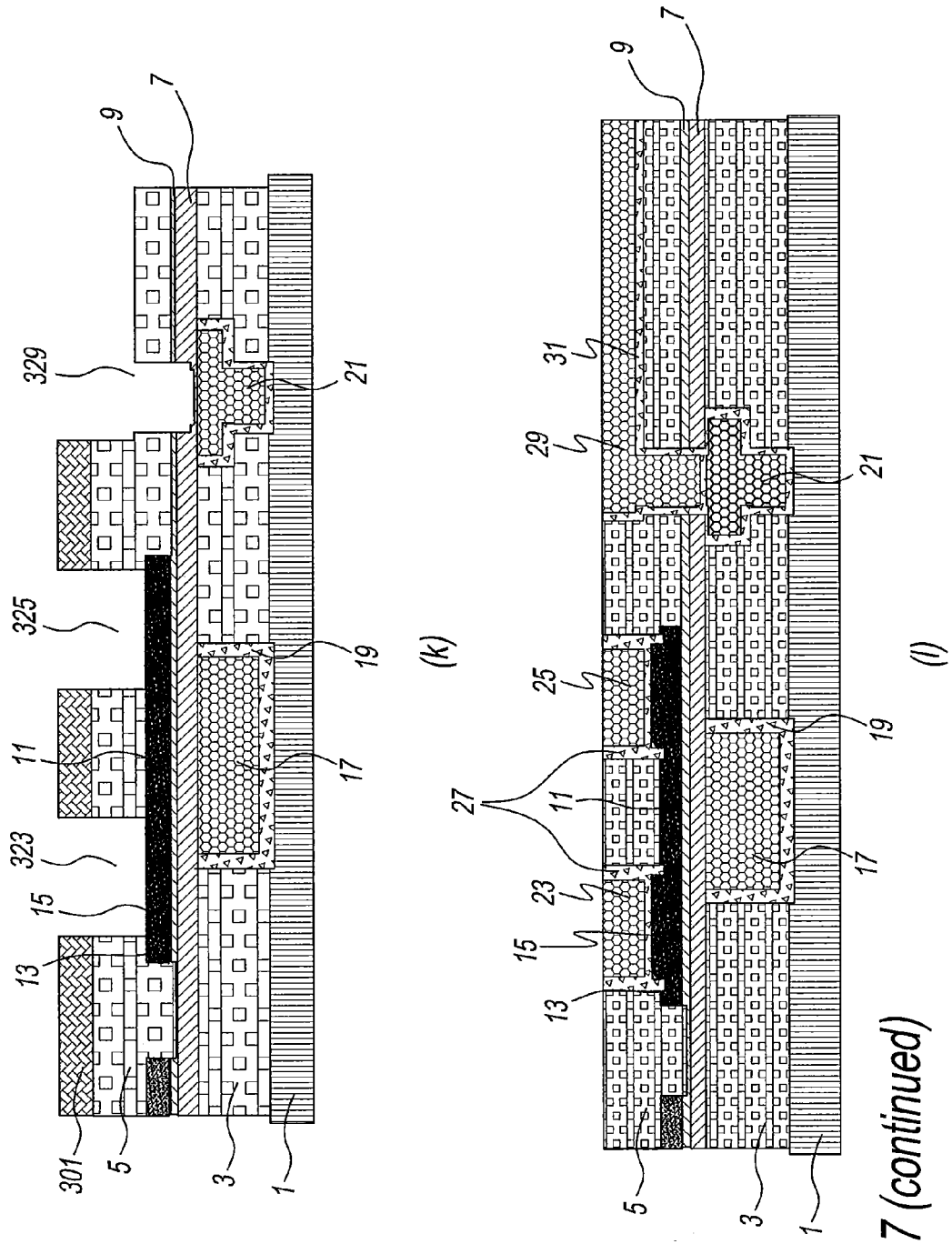

Referring to FIG. 7 and FIG. 8, a method of forming an electrical interconnect structure including thin film transistors is described.

The method of forming the interconnect structure includes the steps of: forming a first interlayer dielectric 3 on a substrate 1 (FIG. 7a), forming conducting metal structures 17 and 21 in the first interlayer dielectric by standard single of dual damascene processing (FIG. 7b), depositing and insulating material or materials 7 and 9 then depositing a semiconductor material 11, preferably at a temperature below 450° C. (FIG. 7c), patterning the semiconductor material (FIG. 7d), depositing a second planarizing interlayer dielectric material 5 (FIG. 7e), patterning the second interlayer dielectric material 5 forming openings 323 and 325 to expose the semiconductor material (FIG. 7f), forming doped regions 13 in the semiconductor material by ion implantation (FIG. 7g), filling the etched regions with a sacrificial planarizing material 303 (FIG. 7j), patterning and etching to form openings 329 that will become line and via interconnect structures (FIG. 7k), metallizing the openings to form source and drain contacts 23 and 25 and interconnect structures 29.

The method can further include annealing the semiconductor material 11 at a temperature below 450° C. to crystallize or recrystallize the material.

The method can further include depositing patterning 301 and photoresist 305 layers atop the second planarizing interlayer dielectric material.

The method can further include forming germanide or silicide regions 15 by depositing a metal 315 (FIG. 7h), annealing the metal to react with the semiconductor material preferably at a temperature below 450° C., and thereafter removing any unreacted metal (FIG. 7i).

The method can further include depositing a conducting liner material prior to the ion implantation to form the doped regions or prior to the metal deposition to form the germanide or silicide regions.

The method can further include removing the liner from only the bottom of the etched regions prior to ion implantation or to metal deposition to form germanide or silicide regions.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An electrical interconnect structure having thin film transistors comprising:
    a first dielectric containing a plurality of conductors wherein some of said conductors form conducting lines and/or vias, and other conductors form a gate electrode of said thin film transistors;
    an insulating material atop said gate electrode;
    a semiconductor having spaced-apart doped source and drain regions with a channel disposed therebetween atop said insulating material, wherein said semiconductor is a polycrystalline semiconductor formed at temperatures below 450° C.; and
    a second dielectric having a plurality of conductors where some conductors form conducting lines and/or vias, and other conductors form contacts to said source and drain regions of said thin film transistors
    wherein said electrical interconnect structure includes n-type thin film transistors in one set of interconnect levels and p-type thin film transistors in a second set of interconnect levels, wherein said n-type transistors are formed with CdSe as the semiconductor material and said p-type transistors are formed with polycrystalline Ge as the semiconductor material.

2. The electrical interconnect structure of claim 1, further comprising: a conducting or insulating diffusion barrier atop said gate electrode and said lines and vias, wherein said insulating diffusion barrier comprises a material selected from the group consisting of: SiN, materials containing Si, C, N, and H, materials containing Si, C, and H, and insulating materials that have barrier properties that inhibit diffusion of the gate metal.

3. The electrical interconnect structure of claim 2, wherein said diffusion barrier is a continuous, insulating diffusion barrier atop both of said conductors and said first dielectric.

4. The electrical interconnect structure of claim 2, wherein said diffusion barrier is a conducting diffusion barrier, and wherein said conducting diffusion barrier is disposed selectively atop said conductors, not atop said first dielectric.

5. The electrical interconnect structure of claim 2, wherein said insulating diffusion barrier is said insulating material atop said gate electrode.

6. The electrical interconnect structure of claim 5, wherein said conducting diffusion barrier selectively disposed atop said metal conductors comprises a material selected from the group consisting of: CoWP, Ta, W, Mo, TiW, TiN, TaN, WN, TiSiN, TaSiN, and combinations thereof.

7. The electrical interconnect structure of claim 2, wherein said conducting diffusion barrier comprises a material selected from the group consisting of: TiN, TaN, TiSiN, metal nitrides, metal silicon nitrides, conductive metal carbides, Ti, Ta, W, WN, Cr, Nb and combinations thereof.

8. The electrical interconnect structure of claim 1, wherein said first dielectric layer and second dielectric layer can be the same or different materials selected from the group consisting of: an insulating oxide, a low k dielectric material, a porous low k dielectric material, and a dielectric containing air gaps.

9. The electrical interconnect structure of claim 1, wherein said conducting line and/or vias have a metal selected from the group consisting of: Cu, Al, W, and Ag; said gate electrode has a metal selected from the group consisting of: Cu, Al, W, Ag, Er, Ni, Co, Au, Sn, poly-Si, and poly-Ge, and said source and drain contacts have a metal selected from the group consisting of: Cu, Al, W, Ag, Er, Ni, Co, Au, and Sn.

10. The electrical interconnect structure of claim 1, wherein said semiconductor material is a polycrystalline material with a bulk mobility of greater than 100 $cm^2/Vs$, comprising a material selected from the group consisting of: a polycrystalline Ge, polycrystalline SiGe, CdSe, polycrystalline Si, amorphous Si, amorphous Ge, these materials further including carbon, InAs, InAlAs, InGaAs, and other III-V compounds.

11. The electrical interconnect structure of claim 1, wherein said spaced apart doped source and drain regions comprise a material selected from the group consisting of: B, As, P, Ga, In, Al, and Zn.

12. The electrical interconnect structure of claim 1, wherein said insulating material atop said gate electrode is comprised of one or more layers comprising a material selected from the group consisting of: $SiO_2$, silicon nitride, silicon oxynitride, silicon-containing oxides, insulating metal oxides, insulating metal nitrides, insulating metal silicon oxides, insulating metal silicon oxynitrides, germanium oxynitride, germanium-containing oxide, insulating metal germanium oxides, insulating metal germanium oxynitrides, materials containing Si, C, N, and H; SiN, and materials containing Si, C, and H.

13. The electrical interconnect structure of claim 1, further comprising at least one of:
  a second gate electrode above said semiconductor region;
  an insulating material between said semiconductor region and said second gate electrode covering the entire surface of the semiconductor material and/or surrounding the bottom and sidewalls of said gate electrode; and optionally
  a conducting diffusion barrier liner on at least one side of said gate electrode.

* * * * *